United States Patent [19]

Morrell et al.

[11] 4,188,513
[45] Feb. 12, 1980

[54] ELECTRET MICROPHONE WITH SIMPLIFIED ELECTRICAL CONNECTIONS BY PRINTED CIRCUIT BOARD MOUNTING

[75] Inventors: Ronald J. Morrell, Romoka; Beverley W. Gumb; Algirdas J. Dragunevicius, both of London, all of Canada

[73] Assignee: Northern Telecom Limited, Montreal, Canada

[21] Appl. No.: 957,539

[22] Filed: Nov. 3, 1978

[51] Int. Cl.² .................................................. H04R 19/04
[52] U.S. Cl. ....................................................... 179/111 E
[58] Field of Search ............................ 179/111 R, 111 E Primary Examiner—George G. Stellar
Attorney, Agent, or Firm—Sidney T. Jelly

[57] ABSTRACT

A telephone transmitter sub-assembly has an electret clamped between a pair of printed circuit boards. The electret conducting surface and printed circuit patterns on the boards have an overlapping arrangement at a planar junction. The arrangement connects a capacitor, of which the electret forms part, into an amplifying circuit.

15 Claims, 6 Drawing Figures

U.S. Patent  Feb. 12, 1980  Sheet 1 of 3  4,188,513
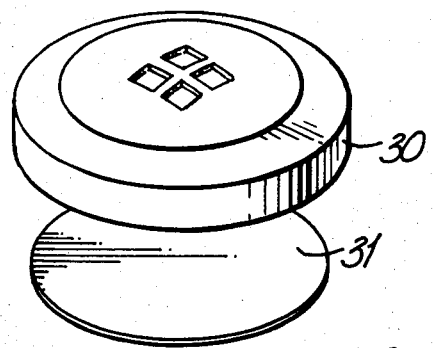
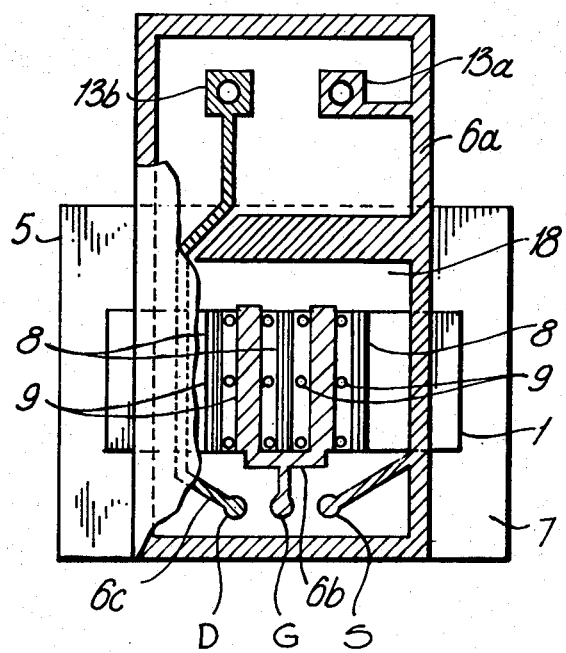
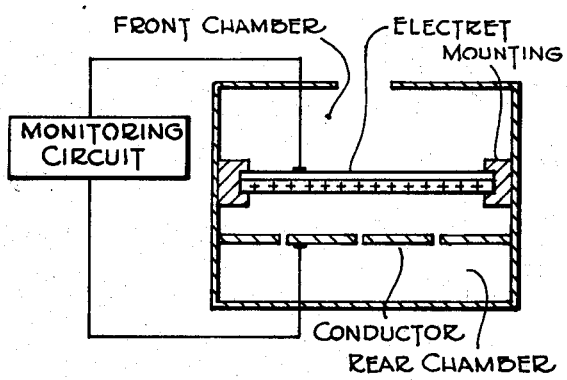
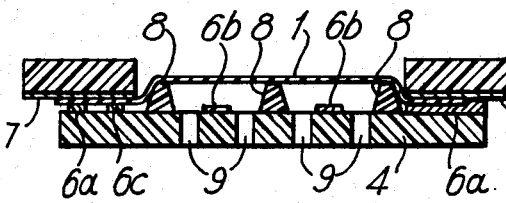

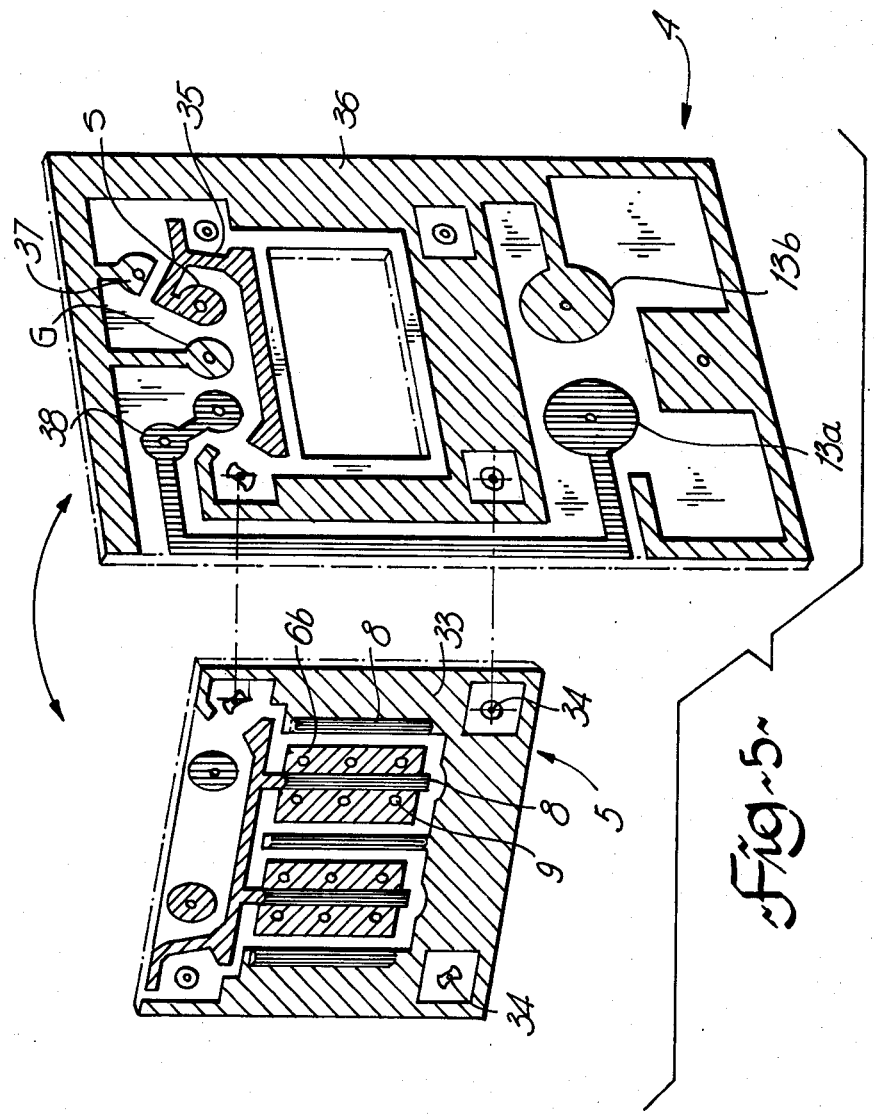

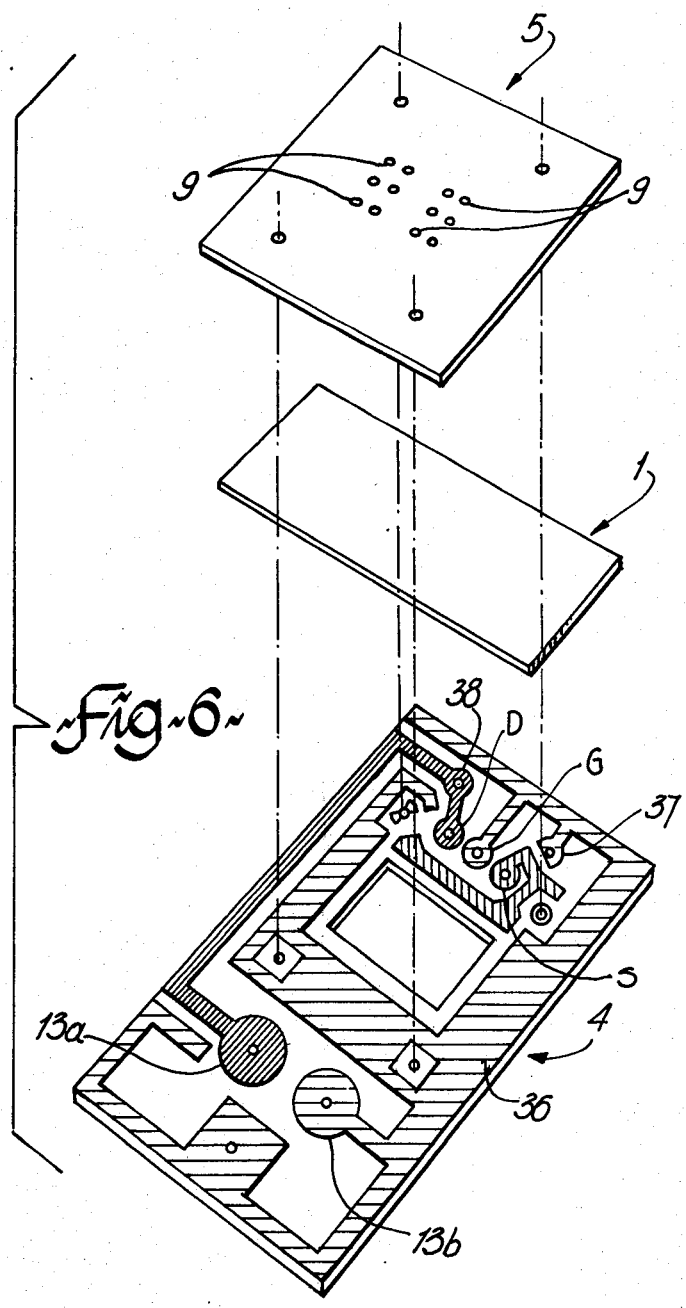

ELECTRET MICROPHONE WITH SIMPLIFIED ELECTRICAL CONNECTIONS BY PRINTED CIRCUIT BOARD MOUNTING

This invention relates to microphone transmitters for telephones and is particularly concerned with such transmitters whose operation is based on the capacitive properties of an electret. Manufacture of telephone transmitters must meet a number of performance criteria; for a volume manufacturer, these criteria must be reconciled with a design which is simple and lends itself to mass production.

Dwelling for a moment on what could be termed the common features of an electric microphone or transmitter, it can be viewed as having an acoustic system and an electrical monitoring system. The acoustic system ensures that, in response to sound pressure waves, the electret vibrates and, as will be shown hereafter, it typically has a front chamber having a passage for sound pressure waves, an electret, mounted so that it is unwrinkled, and a rear chamber allowing the electret to vibrate. The electrical monitoring subsystem has, typically, a laminar conductor spaced from the electret's charged surface and monitoring leads from the conductor and from the electret's conducting surface to monitor capacitance variation between the conductor and the electret.

Turning now to prior art embodiments of the schematic design, recent ones feature structures which combine the mounting and monitoring functions.

As disclosed in U.S. Pat. No. 3,895,194, hollow rectangular conductors provide both the means for monitoring the potential at the electret's conducting surface and also the means for clamping the electret to a centre plate, (first level). The centre plate has a conducting coating facing and spaced from the electret's charged surface (second level). The coating extends through a hole in the plate onto its reverse surface. Mounted against a part of this surface, (third level), and electrically contacting it, is a miniature imperforate circuit board from whence the potential at the other face of the electret capacitor can be monitored. The reverse surface of the plate is recessed, (fourth level), over part of its area to allow fluid communication between the front and rear chambers. This sub-assembly thus has four levels at which electrically conducting means are formed.

U.S. Pat. No. 4,046,974 likewise has a centre plate, (first level), with a conducting coating facing and spaced from the electret's charged surface, (second level). The coating extends through holes in the plate onto its reverse surface. Mounted against this surface is a circuit board from which the potential of one face of the electret capacitor is monitored. The other potential is monitored from the top surface, (third level), of an apertured conducting plate which clamps the electret against an insulating spacer, (fourth level), itself located against the centre plate. The monitoring contact, a U-shaped sprung member, has a tail which fits into terminals, (fifth level), projecting from the circuit board to complete the circuit. This sub-assembly thus has five levels at which electrically conducting means are formed.

The profusion of junction layers at which electrical conduction and mechanical clamping take place is, it is considered, unwarranted and for mechanical integrity and facilitates volume manufacture, a simplified structure makes more sense.

In its broadest aspect the invention comprises an electret assembly having two perforate printed circuit boards with an electret clamped between them so that the electret can vibrate, the electret conducting surface and printed circuit patterns on the boards having an overlapping contacting arrangement at a preferably planar clamping junction.

Preferably one of the printed circuit boards has an array of thick film islands deposited to close thickness tolerances, the islands functioning to space the electret from the printed circuit board.

In a preferred embodiment the boards are laminar and said clamping means comprise stakes. In an alternative embodiment edge portions of the boards are coincident, with the electret projecting from between the coincident edge portions, and a spring U-piece clamped over each coincident edge portion to clamp the projecting electret and edge portions together.

The reverse surface of one of the boards preferably supports circuit components electrically connected to the conducting areas on the boards. The components can include amplifier means, for example, a field effect transistor. Said components may further include output terminals and a capacitor for combatting the effect of noise spikes on the amplifier means.

According to another aspect of the invention a telephone transmitter includes an assembly as defined hereinbefore and further comprises a two-part housing, the first part of the housing having sound inlet apertures positioned over the perforate part of one of the boards. A second part of the housing can have a chamber located on the remote side of the assembly from the sound inlet apertures and underlying the perforate part of the other circuit board.

Preferably elastomeric gaskets lie intermediate the electret assembly and the housing parts to provide acoustic sealing.

Embodiments of the invention are now described in relation to the accompanying drawings in which:

FIG. 1 is a schematic view of a prior art telephone transmitter electret assembly;

FIG. 2 illustrates in perspective, exploded manner a telephone transmitter according to the present invention;

FIG. 3 illustrates a cross-sectional view of a sub-assembly of the transmitter;

FIG. 4 is a schematic illustration showing how electrical contact surfaces interconnect in one embodiment of the invention;

FIG. 5 is a schematic illustration showing how electrical contact surfaces interconnect in an alternative embodiment of the invention; and FIG. 6 illustrates in perspective exploded manner a telephone transmitter sub-assembly corresponding to the FIG. 5 embodiment.

Referring to the drawings in detail, FIG. 1 marked PRIOR ART shows the common features of an electret microphone. Typically it can be viewed as having an acoustic system and an electrical monitoring system. The acoustic system, which ensures that, in response to sound pressure waves, the electret vibrates, has a front chamber having a passage for sound pressure waves, an electret, mounted so that it is unwrinkled, and a rear chamber allowing the electret to vibrate. The electrical monitoring sub-system has typically a laminar conductor spaced from the electret's charged surface and monitoring leads from the conductor and from the electret's conducting surface to measure capacitance variation between the conductor and the electret.

With reference to FIG. 2, the primary component of the telephone transmitter is a diaphragm 1 of electret tape having a conducting upper surface region 2 and a plastics lower surface region 3, the plastics region having a permanent electrostatic charge distributed throughout a surface layer.

Flanking the electret 1 are circuit boards 4 and 5.

As shown in FIG. 3 printed on the upper surface of the circuit board 4 are conducting patterns 6a, 6b and 6c while printed on the lower surface of the board 5 is a conducting pattern 7. On assembly, these surfaces interface to provide electrical interconnections which can be deduced from FIG. 4 in which the conducting patterns are mapped out and their locations indicated with respect to that of the electret 1.

As shown in FIG. 3, the electret is mounted in spaced relationship to the circuit board 4 so that it can vibrate without impediment. The electret is supported by three parallel strips 8 of a dielectric material formed with a thickness of 2 thou(50μm). A particularly useful dielectric is a film material called RISTON which is obtainable from DuPont de Nemours and is of particular value in that its thickness can be guaranteed to within very close tolerances. This material additionally offers some resilience for the electret mounting. In electret mounting schemes, other arrangements of electret spacers (not shown) can be used. For instance additional strips of RISTON, which may be of reduced thickness, applied intermediate strips 8, have been found useful to prevent the electret from contacting pattern 6b. If the charge attraction between the electret 1 and the board coupled with vibration of the electret caused by speech do result in such contact, vibration is restricted so reducing microphone performance. In another example instead of strips, a latticework of tiny circular islands is used; this arrangement is particularly useful because it permits air pressure changes below the electret to dissipate rapidly before damping can take place. To further aid this, banks of perforations 9 through the circuit board 4 provide fluid communication between the charged face of the electret and a rear chamber 10 within a cast zinc casing 11. Without the rear chamber, vibration of the diaphragm electret will be unacceptably damped. The chamber 10, incidentally, functions to accommodate a field effect transistor 17 projecting from the lower surface of the circuit board.

Adjacent the rear chamber 10, the casing has a hole 12 allowing access to terminals 13 projecting from the circuit board 4. Skirting these casing formations are stakes 14 and rectangular projections 15 used to accurately site the printed circuit board relative to the casing 11. An elastomeric gasket 16 ensures acoustic sealing of the chamber 10.

The board 5 has apertures 18 and 19. The aperture 18 is slightly larger than the area defined by the strips 8 so that when the boards 4 and 5 are clamped together, the spaced part of the electret projects into the aperture. The aperture 19 is merely to accommodate solder buildup at the site of component terminals.

Over the board 5, an aluminum ferrule 30, apertured to pass sound pressure waves, accommodates a thin membrane 31 which functions as a spit-stopper and fits into the casing 11. Another elastomeric gasket 32 provides acoustic sealing of a front chamber represented by the hole 18.

Turning now to the interfaces between the lower surface of board 5, upper surface of board 4, and the electret tape, it is immediately noticeable that, disregarding the thickness of the electret, all contact surfaces are at one planar level.

Considering FIGS. 3 and 4, it can be seen that the conducting area 6b and the electret lower surface are spaced apart, the opposed surfaces functioning as a variable capacitor. One "lead" from the capacitor controls a gate terminal (G) of the FET. The other "lead", i.e. the top conducting surface of the electret 1 is contacted by pattern 7 so transferring its potential to pattern 6a and thence to terminal 13a and FET source (S). The FET drain terminal (D) is connected by the pattern 6c direct to terminal 13b. The FET functions to amplify output of the electret variable capacitor, an amplified speech signal being available at the quick-connect terminals 13a and 13b.

One advantage of this simplified structure is that it is very easy to assemble. The various components are stacked onto the casing and when the board 5 is in place and the electret tensioned, stakes 14 are driven through holes 21 in the boards 4 and 5. The stakes are driven against an anvil to swage their ends, thereby clamping the assembly together. The transmitter is finished by attaching the ferrule 30 to the casing 11 around the electret sub-assembly. It is believed that the structure disclosed is preferable to prior art transmitters in that reliability will accrue from reducing the number of clamping and electrical contact interfaces.

Referring to FIGS. 5 and 6, an alternative circuit configuration is shown. In this embodiment, to facilitate the manufacturing process, circuit patterns (shown separately) are more evenly distributed between the two printed circuit boards 4 and 5. Features corresponding to those of FIG. 4 have like reference numerals.

The conducting area 6b is printed on the board 5 as are the spacing strips 8. Consequently, the electret 1 must be inverted so that its charged surface faces the area 6b. In addition, perforations 9 are present in top board 5, and aperture 18 extends through bottom board 4. Area 33 is printed to preserve consistency of thickness of contacting circuit patterns at the clamping junction. In this regard the board 5 has isolated islands 34 to prevent localized stresses when the stakes 14 are driven through the bores 21 on assembly. The board 4 has an area 35 which transfers the potential on area 6b to the source (S) of the field effect transistor (FET) 17. An area 6a picks up the varying potential on the electret conducting surface and transfers it to the FET gate (G), to one terminal 37 of a capacitor and to a quick-connect terminal 13b. Finally, a conducting area 6c links the other quick connect terminal 13a to the other terminal 38 of the capacitor and to the drain (D) of the FET. The circuit functions in a fashion similar to that of FIG. 4, the chief difference being that the capacitor, which projects into chamber 10, prevents noise spikes from over-loading the FET. The capacitor could of course be incorporated in the FIG. 4 circuit.

FIG. 6 illustrates the alternative arrangement the boards 4 and 5 and electret 1 as compared with the embodiment of FIG. 1.

Details of alternative embodiments which are not shown in the Figures are now briefly described.

In one embodiment, the circuit boards are screwed together prior to the sub-assembly being staked against the zinc casing 11. In another embodiment, the board 5 is of a more complex shape enabling it to be press-fitted into the casing. In another embodiment a separate contact strip functions in the same manner as the conducting region 7 of the earlier embodiment. Finally the circuit boards can be clamped together along coincident edge portions where electret edges project, such clamps taking the form of sprung beryllium-copper U-clips.

Alternatively shaped patterns of conducting areas will be apparent to those skilled in the art. For example the whole of the lower face of the board 5 can be metallized if an insulating layer is placed over pattern 6c and exposed parts of pattern 6b. A useful advantage of applying RISTON to different thicknesses for strips 8 is that RISTON of reduced thickness can be used to provide the insulating layer thereby reducing the number of preparation steps.

What is claimed is:

1. An electret microphone assembly comprising:
   a first circuit board having a first conducting pattern on an obverse surface thereof and at least one perforation therethrough;
   a second circuit board having a second conducting pattern on an obverse surface thereof and at least one perforation therethrough;
   an electret diaphragm located between said circuit boards with a charged surface thereof facing the first circuit board conducting surface and a conducting surface thereof facing the second circuit board conducting surface;
   spacing means adjacent said first circuit board to space one portion of the electret from a first conducting area of said first conducting pattern, said spacing means and said spaced electret part being accommodated in the perforation of at least one of the boards; and
   clamping means clamping said first and second circuit boards together said circuit boards having matched contours at a junction region, in which region another portion of said electret is clamped to mount said one portion of the electret over the spacing means and in which region said conducting patterns electrically contact and cooperate with said electret conducting surface to electrically connect first and second terminals located on the reverse side of one of the circuit boards respectively to the first conducting area and to the electret conducting surface.

2. An electret assembly as claimed in claim 1 in which said matched contours produce a substantially planar junction region.

3. An electret assembly as claimed in claim 1 in which said first circuit board has an array of thick film deposits to form said spacing means.

4. An electret assembly as claimed in claim 1 wherein said terminals are located on a reverse surface of the first plate, said first conducting area is connected direct to the first terminal, a second conducting area on said second board electrically contacts both the electret conducting surface and a third conducting area on the first plate, the third conducting area being electrically connected to the second terminal.

5. An electret assembly as claimed in claim 1 wherein said terminals are located on the reverse surface of the second plate, said first conducting area electrically contacts a second conducting area on the second board, said second conducting area being connected to said first terminal, and a third conducting area on said second board electrically contacts said electret conducting surface and is electrically connected to the second terminal.

6. An electret assembly as claimed in claim 1 wherein said clamping means comprise stakes.

7. An electret assembly as claimed in claim 1 wherein a reverse surface of one of the circuit boards supports circuit components electrically connected to said terminals.

8. An electret assembly as claimed in claim 7 wherein one of said components is a field effect transistor (FET) having source, gate and drain terminals, one of said first and second terminals functioning as the FET gate terminal and the other of said first and second terminals functioning as one of the FET source and drain terminals.

9. An electret assembly as claimed in claim 8 wherein said components also include a pair of output terminals connected respectively to the gate terminal and to the other of the FET source and drain terminals.

10. An electret assembly as claimed in claim 9 in which said assembly is substantially rectangular, the electret and the perforations being aligned and substantially centrally located and the FET and output terminals located on opposite sides of the centrally located perforations.

11. An electret assembly as claimed in claim 1 and further comprising a two-part housing, the first part of said housing having sound inlet apertures, the sound inlet apertures and the perforations in said circuit boards being generally aligned, the combination constituting a telephone transmitter.

12. A telephone transmitter as claimed in claim 11 the second part of said housing having a chamber located on the remote side of the assembly from the sound inlet apertures and underlying said at least one perforation in its adjacent circuit board.

13. A telephone transmitter as claimed in claim 12 in which an elastomeric member intermediate the electret assembly and the second housing part provides an acoustic seal between the electret assembly and the second housing part at the boundary of the chamber.

14. A telehone transmitter as claimed in claim 12 said electret assembly having amplifying means mounted thereon, said amplifying means projecting into the chamber.

15. A telephone transmitter as claimed in claim 12 said electret assembly further having output terminals mounted thereon, said terminals accessible through a hole in said second housing part.

* * * * *